(12) United States Patent
Bratkovski et al.

(10) Patent No.: US 8,390,705 B2
(45) Date of Patent: Mar. 5, 2013

(54) NANOWIRE PHOTODIODES

(75) Inventors: Alexandre M. Bratkovski, Mountain View, CA (US); Vilatcheslav V. Osipov, Palo Alto, CA (US)

(73) Assignee: Hewlett-Packard Develoment Company, L.P., Houston, TX (US)

( * ) Notice: Subject to any disclaimer, the term of this patent is extended or adjusted under 35 U.S.C. 154(b) by 577 days.

(21) Appl. No.: 12/606,947

(22) Filed: Oct. 27, 2009

(65) Prior Publication Data

US 2011/0096218 A1 Apr. 28, 2011

(51) Int. Cl.
*H04N 3/14* (2006.01)
*H04N 5/335* (2011.01)

(52) U.S. Cl. ......... 348/294; 977/762; 977/936; 977/938

(58) Field of Classification Search ............... 348/222.1, 348/294–324; 250/208.1; 257/290–292; 438/99, 962, 904; 977/762, 936, 938
See application file for complete search history.

(56) References Cited

U.S. PATENT DOCUMENTS

| | | | |
|---|---|---|---|
| 7,051,945 B2 | 5/2006 | Empedocles et al. | |
| 7,068,898 B2 | 6/2006 | Buretea et al. | |
| 7,211,464 B2 * | 5/2007 | Lieber et al. | 438/99 |
| 7,301,199 B2 | 11/2007 | Lieber et al. | |
| 2007/0151099 A1 | 7/2007 | Tsakalakos | |
| 2007/0176824 A1 * | 8/2007 | Stumbo et al. | 342/372 |
| 2007/0177139 A1 | 8/2007 | Kamins et al. | |
| 2011/0079704 A1 * | 4/2011 | Yu et al. | 250/208.1 |
| 2011/0180894 A1 * | 7/2011 | Samuelson et al. | 257/438 |

FOREIGN PATENT DOCUMENTS

WO 2008156421 A2 12/2008

OTHER PUBLICATIONS

Chonbuk National University, Department of Physics, Jeonju 561-756, Korea, Structural and Electrical Properties of Core-Shell Structured GaP Nanowires with Outer Ga2O3 Oxide Layers, Published online: Sep. 20, 2006—Springer-Verlag 2006.

Hwang, In-Sung et al, A facile fabrication of semiconductor nanowires gas sensor using PDMS patterning and solution deposition, Department of Materials Science and Engineering, Korea University, Nov. 5, 2008, 2008 Elsevier B.V. All rights reserved.

Soci, C. et al, ZnO Nanowire UV Photodetectors with High Internal Gain, Department of Electrical and Computer Engineering, University of California, Mar. 15, 2007, 2007 American Chemical Society.

Yang et al, UV photodetectors with lateral self-assembled ZnO nanowires grown at low temperature, Department of Electronics Engineering and Institute of Electronics, Ming Chi University of Technology, Taiwan.

Lauhon, Lincoln J. et al, Epitaxial core-shell and core-multishell nanowire heterostructures, http://www.nature.com/nature/journal/v420/n6911/full/nature01141.html, Nature 420, 57-61 (Nov. 7, 2002).

* cited by examiner

*Primary Examiner* — Yogesh Aggarwal

(57) ABSTRACT

A photodiode includes a first electrode, a second electrode, and a nanowire comprising a semiconductor core and a semiconductor shell. The nanowire has a first end and a second end, the first end being in electrical contact with the first electrode and the second end being in contact with the second electrode.

22 Claims, 12 Drawing Sheets

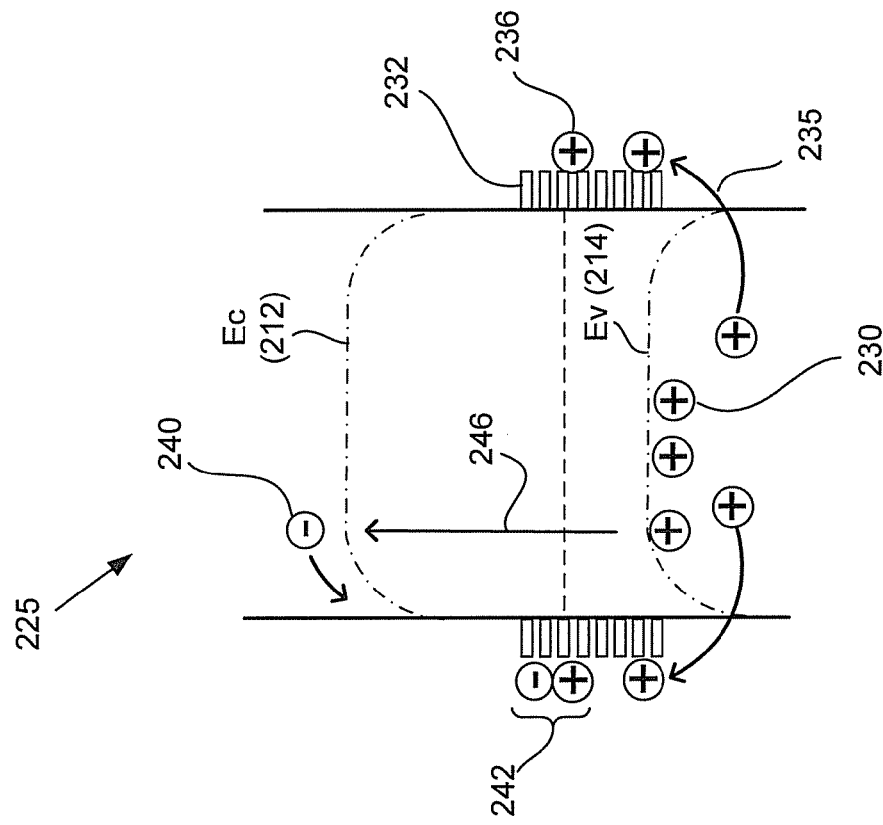
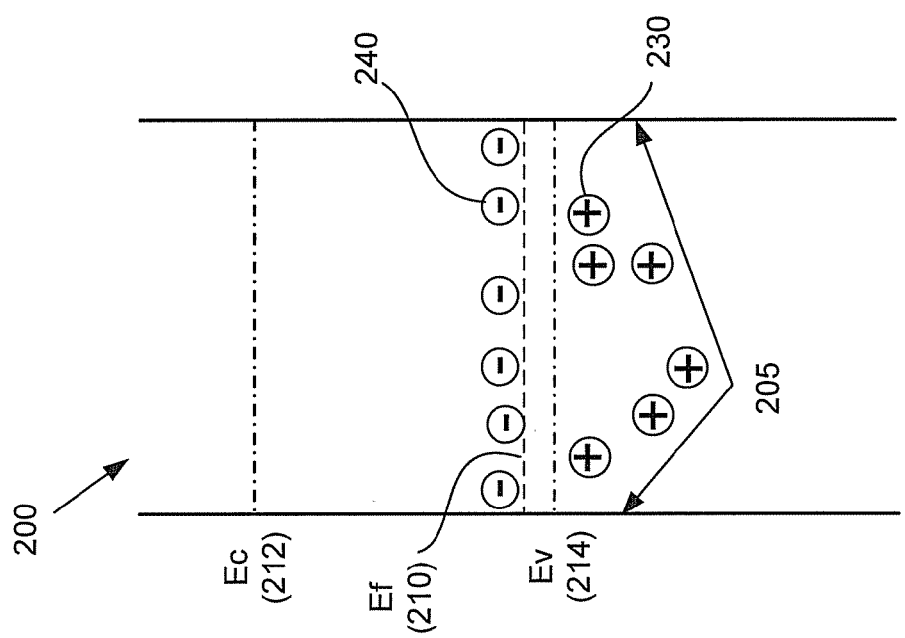

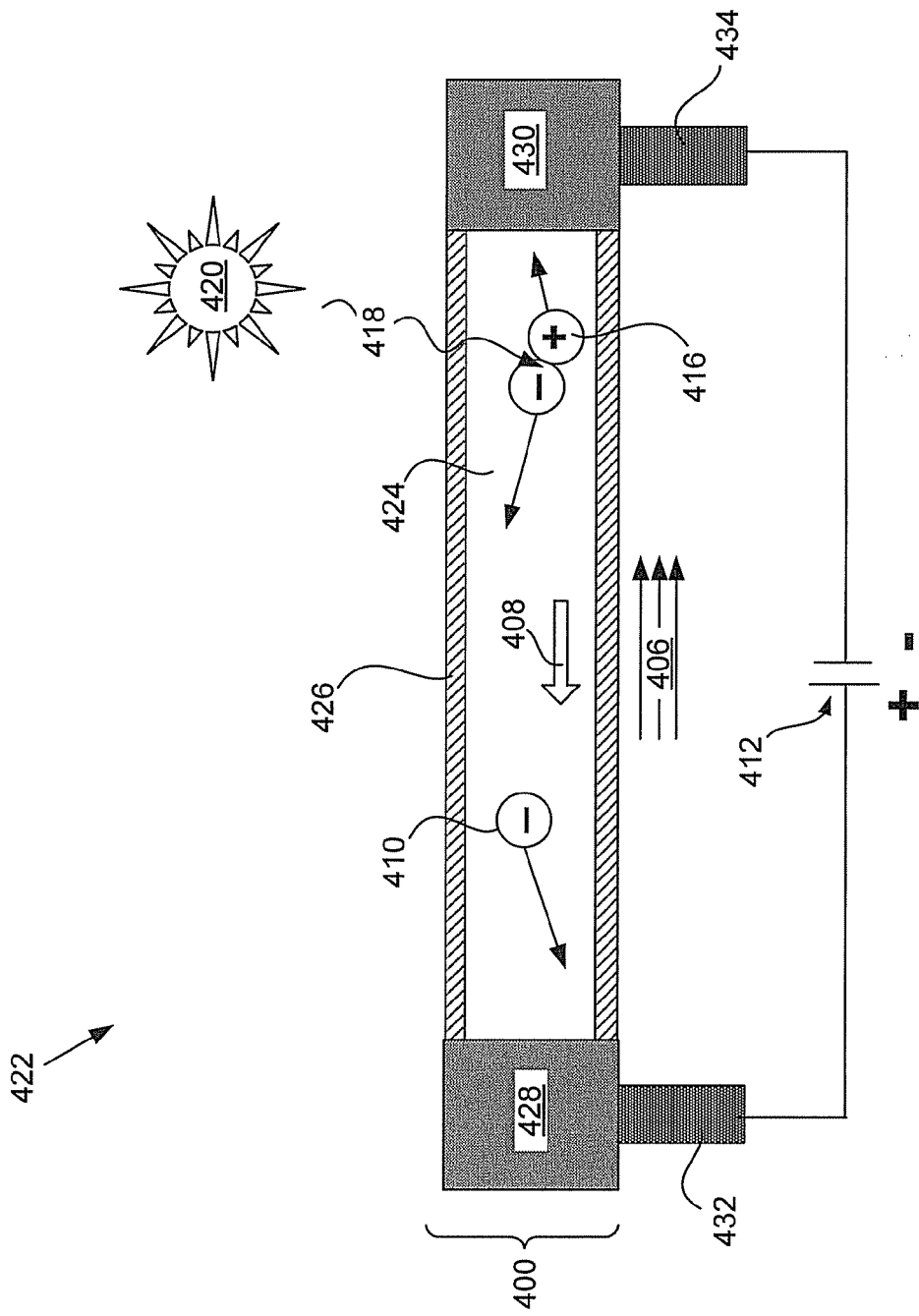

NANOWIRE PHOTODIODES

BACKGROUND

Semiconductors are a class of materials with a wide variety of practical applications. One such application is a photodiode which converts incident photons into electrical energy. In a photodiode, the incident photon transfers its energy to an electron within the semiconductor material. This transferred energy allows the electron to break free from its nuclear orbit. Once free, the electron can flow through the semiconductor material and be collected by an electrode. However, if the electron encounters defects at the surface of the semiconductor or discontinuities within the semiconductor, the electron may fall back into a nuclear orbit. Once the electron returns to a nuclear orbit, it is no longer able to contribute to the flow of electrical current through the photodiode.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIG. 2A is a band diagram of an idealized nanowire, according to one embodiment of principles described herein.

FIG. 2B is a band diagram of an illustrative nanowire which shows charges diffusing out of the bulk material into surface states, according to one illustrative embodiment of principles described herein.

FIG. 4 is a diagram showing an illustrative nanowire photodiode, according to one embodiment of principles described herein.

Throughout the drawings, identical reference numbers designate similar, but not necessarily identical, elements.

DETAILED DESCRIPTION

Figure 1:
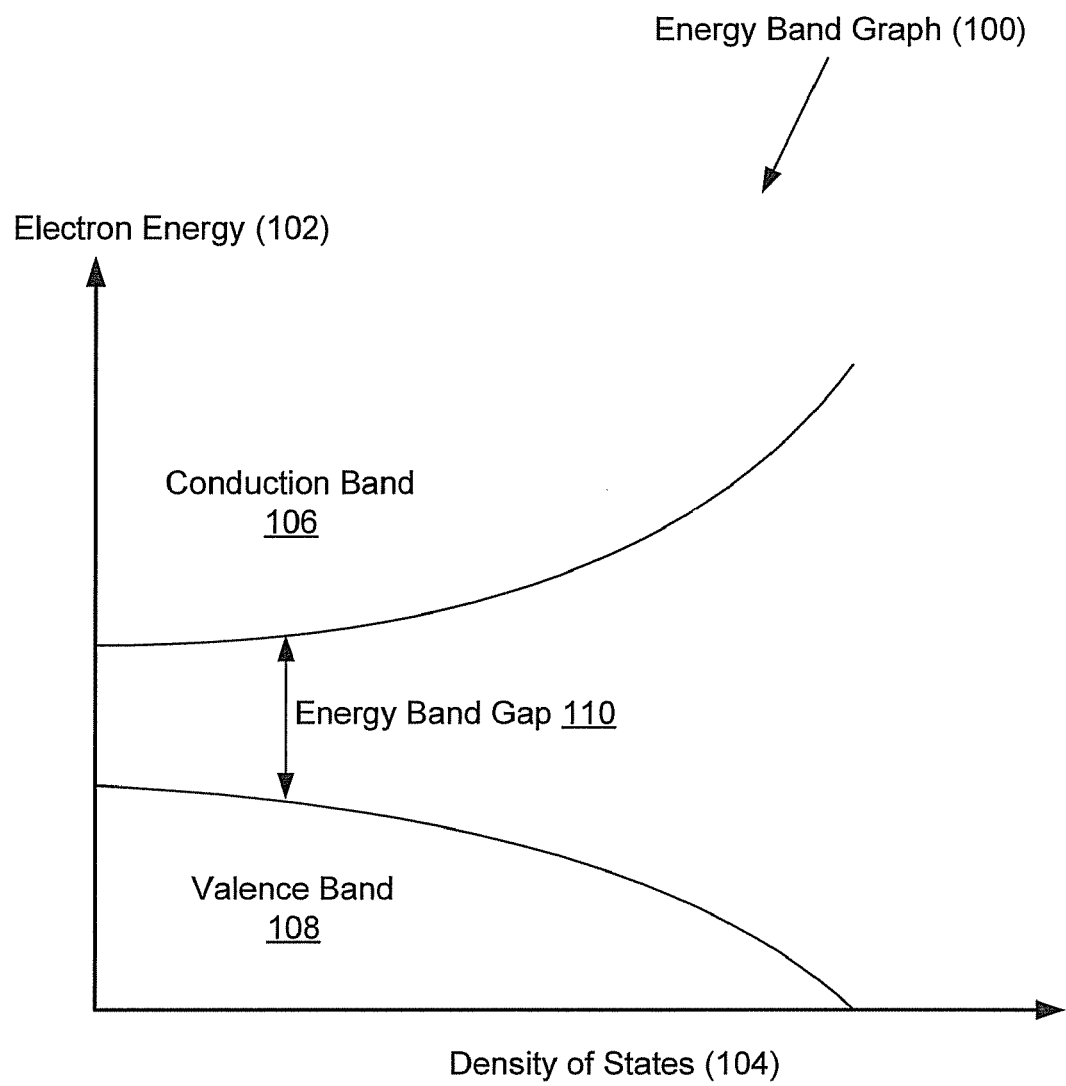
FIG. 1 is an energy band graph illustrating the density of electron states as a function of energy, according to one embodiment of principles described herein.

As mentioned above, semiconductors are a material with a wide variety of practical applications. One such application is a photodiode. In one illustrative embodiment, a photodiode is made of semiconductor materials interposed between two electrodes. A photodiode converts optical energy into an electrical current which flows between the two electrodes. This energy conversion occurs when an incident photon transfers its energy to an electron within the semiconductor material. Electrons within a semiconductor material normally exist within an energy level referred to as the valence band. While an electron is in the valence band, it is contained within a nuclear orbit and unable to move through the semiconductor material. When the energy from the photon has been transferred to the electron, it may jump to a higher energy level referred to as the conduction band. While in the conduction band, the electron is free from any nuclear orbit and is able to flow through the semiconductor material as an electrical current.

The efficiency of a photodiode in capturing photons and converting the photons into an electrical current can depend on a variety of factors, including the geometry and physical structure of the photodiode. According to one illustrative embodiment, a photodiode may be formed in a nanowire geometry. A nanowire typically has a diameter on the order of $10^{-9}$ meters and a length which is typically several orders of magnitude greater than its diameter. This results in the nanowires having a high surface-to-volume ratio, which allows the nanowires to absorb more photons per unit volume than many other structures. Further, when multiple nanowires are grouped together, the nanowires can very efficiently absorb a large percentage of the incident photons.

However, the small diameters and high length-to-width ratios of photodiode nanowires can present challenges in efficiently conducting the free electrons along the length of the nanowire to a collecting electrode. The flow of electrons through a nanowire is strongly influenced by edge effects. The edge effects come from atoms that lay at the nanowire surface and may have dangling bonds, vacancies, impurities, etc., where the charges can get trapped. The trapped charges are then no longer able to contribute to the flow of electrical current through the photodiode. As the diameter of the nanowire shrinks, the surface atoms become more numerous compared to the interior atoms and edge effects become more pronounced.

The present specification discloses a photodiode with increased efficiency in conducting electricity along its length. According to one illustrative embodiment, the efficiency of a nanowire photodiode may be increased by keeping free electrons away from the surface of the nanowire. By keeping the electrons away from the surface, it is more likely that the free electrons will remain free long enough to be collected by an electrode. The more electrons that are collected by an electrode, the higher the detected electrical current between two electrodes placed at either end of the nanowire. Further, the illustrative nanowire photodiode spatially separates opposite charges within the nanowire to reduce the likelihood recombination between two opposite charges.

These nanowire photodiodes may also be used in conjunction with "photon traps" designed to increase the amount of photons absorbed by electrons within the nanowire structure. These efficient nanowire photodiodes may be used in a variety of applications, including but not limited to, solar cells and infrared imaging devices. These and other applications are discussed with respect to nanowire photodetectors in International App. No. PCT/US09/37019 to Alexandre M. Bratkovski, filed Mar. 12, 2009, which is incorporated herein by reference in its entirety.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

FIG. 1 is an energy band graph (100) illustrating electron energy levels as a function of density of states. The vertical axis represents electron energy levels (102), with lower energy levels being illustrated closer to the origin of the graph and higher energy levels being illustrated progressively higher in the graph. The horizontal axis represents the density of electron states (104), with the density of states being lower at the origin and becoming higher when moving to the right. The graph (100) illustrates two basic groups of energy levels in which an electron may reside. These groups of energy levels are referred to as the valence band (108) and the conduction band (106). The valence band (108) and conduction band (106) are separated by an energy band gap (110). The energy band gap (110) is a region in which there are no available energy levels within which electrons may reside.

The density of states (104) illustrated on the horizontal axis refers to the number of electron states within an energy level are available for a given electron to occupy. An electron will prefer to exist at the lowest energy level available. As the density of electrons increases, more electron states within the lower energy levels are available. Therefore, the higher the density of states (104), the more electrons will be able to exist at lower energy levels. Consequently, the energy band gap (110) between the valence band (108) and the conduction band (106) increases as the distribution of electrons moves into lower energy levels.

If a given material has a relatively small energy band gap (110), that material is classified as a semiconductor. For example, if the energy band gap is less than about 3 eV, the material may be considered a semiconductor. Materials with a substantially larger band gap are typically classified as insulators.

In a semiconductor material, an electron normally resides at an energy level within the valence band (108). If an electron is in the valence band (108), it is secured in a nuclear orbit around an atom of the semiconductor material. Because the electron is secured in orbit, it is not free to flow through the semiconductor material and does not contribute to an electrical current.

When an electron gains enough energy, it may jump from the valence band (108) into the conduction band (106). If an electron is in the conduction band (106), it is free from any nuclear orbit and is thus free to move through the semiconductor material. While free, the electron is able to contribute to the flow of electrical current.

FIG. 2A is a cross-sectional diagram of an idealized p-type nanowire (200). In this embodiment, an energy band diagram is shown superimposed over the cross-sectional diagram of the nanowire (200). The energy band diagram shows the electron energy of the valence band Ev (214) and the conduction band Ec (214) as dash-dot lines. Also shown is the Fermi level Ef (210) which is represented as a dashed line.

In this illustration, the p-type nanowire (200) has a clean surface (205). This means that there are no additional surface states on the exterior of the nanowire surface. Because the idealized p-type nanowire (200) has a clean surface, the conduction band Ec (212) and the valence band Ev (214) are straight through the thickness of the nanowire (200). The positive charge carriers (230), which are shown as plus signs, remain within the bulk material which makes up the p-type nanowire.

FIG. 2B is a more realistic band diagram of a p-type nanowire (225). In this illustrative embodiment, there are a number of surface states (232) at the surface of the nanowire. As discussed above, these surface states may result from imperfections in the surface of the nanowire, such as impurities, dangling bonds, etc. Because the diameter of the nanowire (225) is less than the diffusion length for the positive charge carriers (230) and negative charge carriers (240), the charges (230, 240) quickly diffuse (235) into the surface states (232) where they are trapped. This diffusion of charge carriers (230, 240) leaves the interior of the nanowire in a charge depleted state with a correspondingly high electrical resistance.

These charge carriers (230, 240) may have been intentionally placed in the nanowire or may have been unintentionally formed within the nanowire during manufacturing. Introducing impurities into a semiconductor material is called doping. A semiconductor which has been intentionally or unintentionally doped with an impurity which donates weakly bound outer electrons is referred to as an "n-type" semiconductor. Materials used to create n-type semiconductor regions in silicon, germanium, and group IV semiconductors these dopants may include, among others, phosphorous, arsenic, and antimony. A semiconductor material is doped with an impurity material which accepts weakly bound outer electrons from the semiconductor atoms is referred to as p-type semiconductor. Materials used to create p-type semiconductor regions in silicon, germanium and group IV semiconductors may include, among others, boron, aluminum, and indium.

If another semiconducting material is used other dopants may be appropriate. For example, if gallium arsenide is used, the n-type semiconductor region may be doped with group VI and group IV atoms such as sulfur, selenium, tellurium, and silicon. Similarly, the p-type semiconductor region may be formed using group II and group IV atoms such as magnesium, zinc cadmium, and silicon. The dopants may be selected based on the semiconductor material used.

As discussed above, the diameter of the nanowire can be substantially smaller than the diffusion length of the charge carriers. The intentionally or unintentionally included charge carriers rapidly diffuse into the surface states (232) where they are trapped.

Electrical charges which are being conducted along the nanowire can be neutralized in at least two ways. A first way in which a charge carrier can be neutralized is when a charge carrier passes close to the surface of the nanowire and becomes trapped in a surface state or recombines with an oppositely charged carrier which is trapped in one of the surface states (232). This results in the combination of two opposite charge carriers to form a neutralized charge (242). A second way in which a charge carrier can be neutralized is through recombination (246) with oppositely charged carriers in the interior of the nanowire. As the two oppositely charged electron and hole come into contact with each other, the electron becomes trapped in the vacancy in the valence band and is no longer mobile.

The more electrical charge carriers traveling through the nanowire that are neutralized, the less effective the nanowire is in conducting electricity. In some illustrative embodiments, adding a wider band gap shell around a nanowire core can increase the effectiveness of the nanowire in conducting electricity.

Figure 2C:
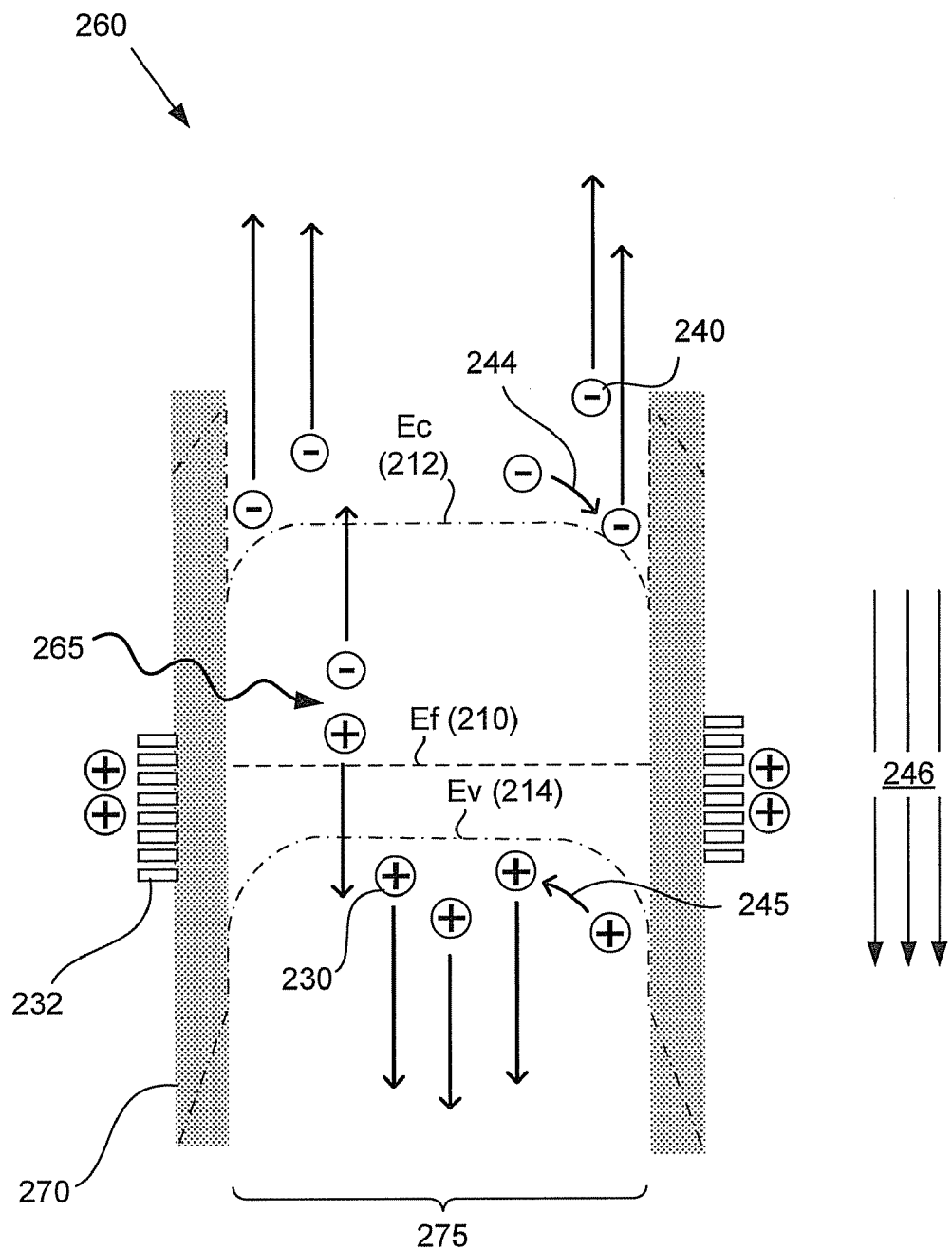
FIG. 2C is a band diagram of an illustrative nanowire with a core/shell structure, according to one illustrative embodiment of principles described herein.

FIG. 2C shows an illustrative photodiode nanowire with a core/shell structure (260). This core/shell structure reduces the neutralization of charge carrier moving through the nanowire. Without being bound by any particular theory, it appears that the core/shell structure reduces both the interaction of the charges with the surface states and the interaction of oppositely charges species. By reducing these interactions, the conduction efficiency of the nanowire can be improved.

The photodiode (260) may be formed from a variety of semiconducting materials. According to one illustrative embodiment, the photodiode (260) could include a core (275) made of narrow band semiconductor material. The narrow band gap core (275) is surrounded by a wider band-gap shell (270). This wider band gap shell (270) may cover the entire perimeter of the core (275).

As mentioned above, semiconductors are a class of materials which have a relatively small energy band gap. Within the semiconductor class, each material has a characteristic energy band gap. For example, given two semiconductor materials, one material will have a narrower band gap than the other material. Throughout this specification and in the appended claims, the term "narrower band-gap" refers to a semiconductor material with a narrower energy band gap compared to other semiconductor materials. The term "wider band-gap" will refer to a semiconductor material with a wider energy band gap compared to other semiconductor materials.

According to one illustrative embodiment, the narrower band gap core (275) could be made of a III-V semiconductor material. A III-V semiconductor material comprises one element from group III of the periodic table of elements and another element is made from group V. One example of a III-V semiconductor material is indium antimonide (InSb) which has a relatively narrow band gap of 0.17 eV at 300 Kelvin. Other semiconductors may have wider band gaps. For example, the wide band gap shell (270) may be made of a ternary alloy of a III-V semiconductor material. One example of a III-V ternary alloy is indium arsenide antimonide (InAsSb), which has a significantly wider band gap than indium antimonide. The band gap of InAsSb may be varied significantly depending on the relative proportion of the various constituent elements. Additionally, the semiconductor materials may have either p- or n-type doping. In the illustrative embodiment, shown in FIG. 2C, the nanowire has p-type doping in the core.

Without being bound by any particular theory, it appears that applying a wider band-gap shell (270) over the exterior of the core (275) creates a relatively clean interface between the shell (270) and the core (275). The surface states (232) are created on the exterior surface of the shell (270) rather than the interface between the shell (270) and the core (275). As previously discussed, the charge carriers quickly diffuse outward into the surface states (232), leaving core (275) in charge carrier depleted state.

The combination of the surface states (232) and the wider band-gap shell (270) produce curvature in the valence band (214) and the conduction band (212) near the interface between the core (275) and the shell (270). For a nanowire with p-dopants, this curvature tends to cause charge motion (245) of the positive charge carriers toward the center of the core (275) and charge motion (244) of the negative charge carriers toward the outer perimeter of the core (275). This spatially separates the oppositely charged carriers, with the negative charges (240) being primarily traveling in an outer annular region of the core (275) and the positive charge carriers traveling through the center of the core (275) The spatial separation of the opposite charges reduces the likelihood of recombination (246, Fig. B) of the oppositely charged carriers as they travel through the nanowire.

Additionally, the combination of a wider band-gap shell (270) with a narrower band-gap core (275) reduces the interaction of the charge carriers with the surface states (232). The wider band-gap shell (270) makes it electrically unfavorable for either the positive charge carriers or the negative charge carriers to interact with the surface states (232) on the exterior of the wider band-gap shell (270). Consequently, there is little interaction between the surface states (232) on the exterior of the shell and the charge carriers (230, 240).

As discussed above, electrical charge carriers (230, 240) may be generated within the narrower band-gap core (275). In order for electrons to jump from the valence band to the conduction band (106, FIG. 1), electrons within the core (275) need to gain enough energy to overcome the energy band gap (110, FIG. 1). One way for an electron to gain energy is to absorb an incident photon (265). When an atom in the core (275) is hit by a photon (265), an electron may absorb enough energy to overcome the energy band gap and jump into the conduction band. The electron then becomes a mobile negative charge (240). Similarly, the hole becomes a mobile positive charge carrier (230) within the valence band (214). The motion of the mobile charge carriers (230, 240) can be influenced by a number of factors, including any internal or external electrical fields which are present. In FIG. 2C, an external electrical field (246) is illustrated. This exterior electrical field (246) permeates the volume of the nanowire (260) and causes the positive charge carriers (230) to move in one direction and the negative charge carriers (240) to move in the opposite direction.

One illustrative embodiment of a nanowire photodiode with a core/shell structure as been discussed above. The nanowire photodiode may include a number of additional elements and configurations.

Figure 3C:
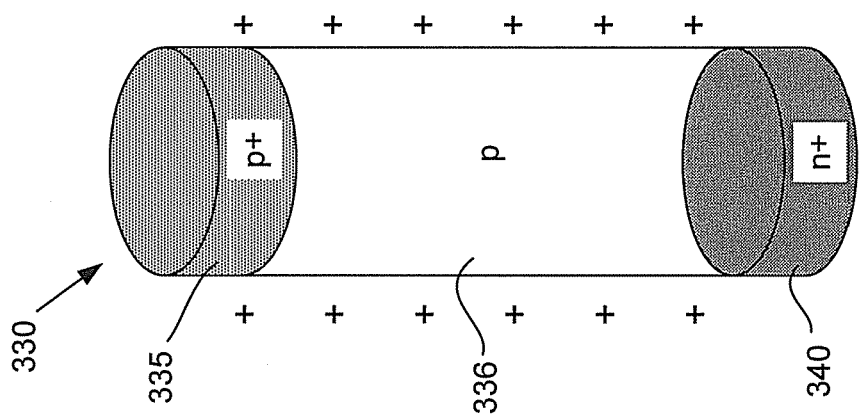
FIGS. 3A-3C are illustrative nanowires which can be used as photodiodes, according to one illustrative embodiment of principles described herein.
Figure 3B:
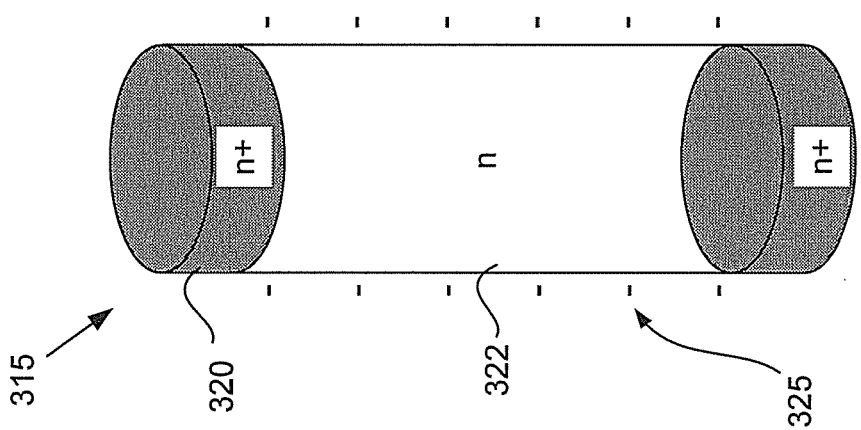
Figure 3A:
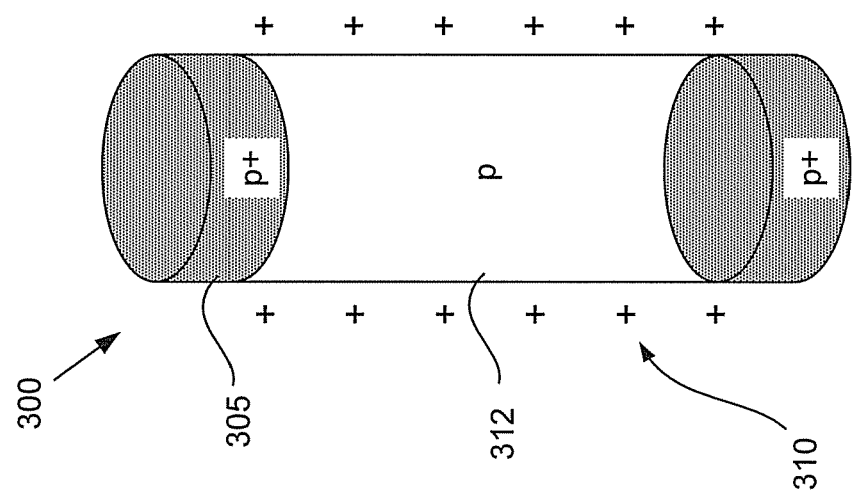

FIG. 3A shows an illustrative p-type nanowire (300) which includes a core/shell with p-type doping (312). As discussed above, this p-type doping may be intentional or unintentional in the core and shell. The p-type nanowire (300) also includes more heavily p-doped sections (305) at either end of the nanowire (300). The more heavily doped sections (305) may improve the collection of the mobile charges and/or provided a better interface to metal electrodes. In this illustrative example, the positive charges (310) become trapped in surface states, leaving the core of the nanowire charge depleted.

Similarly, FIG. 3B shows an illustrative n-type nanowire (315) with core and/or shell which has intentional or unintentionally been doped with negative charges. The negative charges (325) become trapped in surface states. The n-type nanowire (315) also includes end sections (320) which are more heavily doped with an n-type dopant.

FIG. 3C shows an illustrative composite nanowire (330) which includes both an n-doped section (340) and a p-doped section (335). The core/shell structure (336) may be either n-doped or p-doped. As discussed above, the charges produced by the doping diffuse to the exterior surface of the composite nanowire (330) where they may be trapped by the surface states.

FIG. 4 is a diagram of an illustrative nanowire photodiode (422) which includes a nanowire (400) with a core/shell structure. In this illustrative embodiment, the nanowire photodiode (422) is a composite nanowire with one end of the nanowire (400) being an n-doped section (428) and the opposite end being a p-doped section (430). This is only one illustrative example of a nanowire (400) which can be used to form a photodiode (422). The nanowire (400) may have a variety of other compositions, including those shown in FIGS. 3A-3C.

A first electrode (432) and a second electrode (434) are connected to the doped end sections (428, 430). A biasing voltage (412) may be applied across the electrodes (432, 434). This creates electrical field (406) through the nanowire (400).

Based on applied electrical conditions, a photodiode may operate in two basic modes: a photoconductive mode or a photovoltaic mode. In the photoconductive mode, a biasing voltage is applied to the electrodes (432, 434) of the photodiode (422). When the photodiode (422) is reverse biased, very little current will flow through the photodiode (422); however, an electric field (224) will exist within the photodiode (422). The electric field (406) is generally uniform throughout the core (424). With the electrical field (406) present, the mobile electrons (410) move in a direction opposite of the direction of the electric field (204).

In the photovoltaic mode, no biasing voltage (412) is applied. When free electrons (410) and holes (416) are created by incident photons (418), they will be swept away by the built-in electric field created by the n-type (202) and p-type regions (206). A voltage will then build up across the photodiode (422). When the voltage is high enough, electrical current will flow through the photodiode (422).

As discussed above, the nanowire (400) with a core/shell structure limits the interaction between the opposite charge carriers (410, 416) and between surface states on the exterior of the shell (426). This results in the more efficient conduction and collection of photon generated charge carriers. For photodetector applications, this can result in greater sensitivity to light. For photovoltaic applications this can result in more efficient generation of electricity from incident light.

Figure 5:
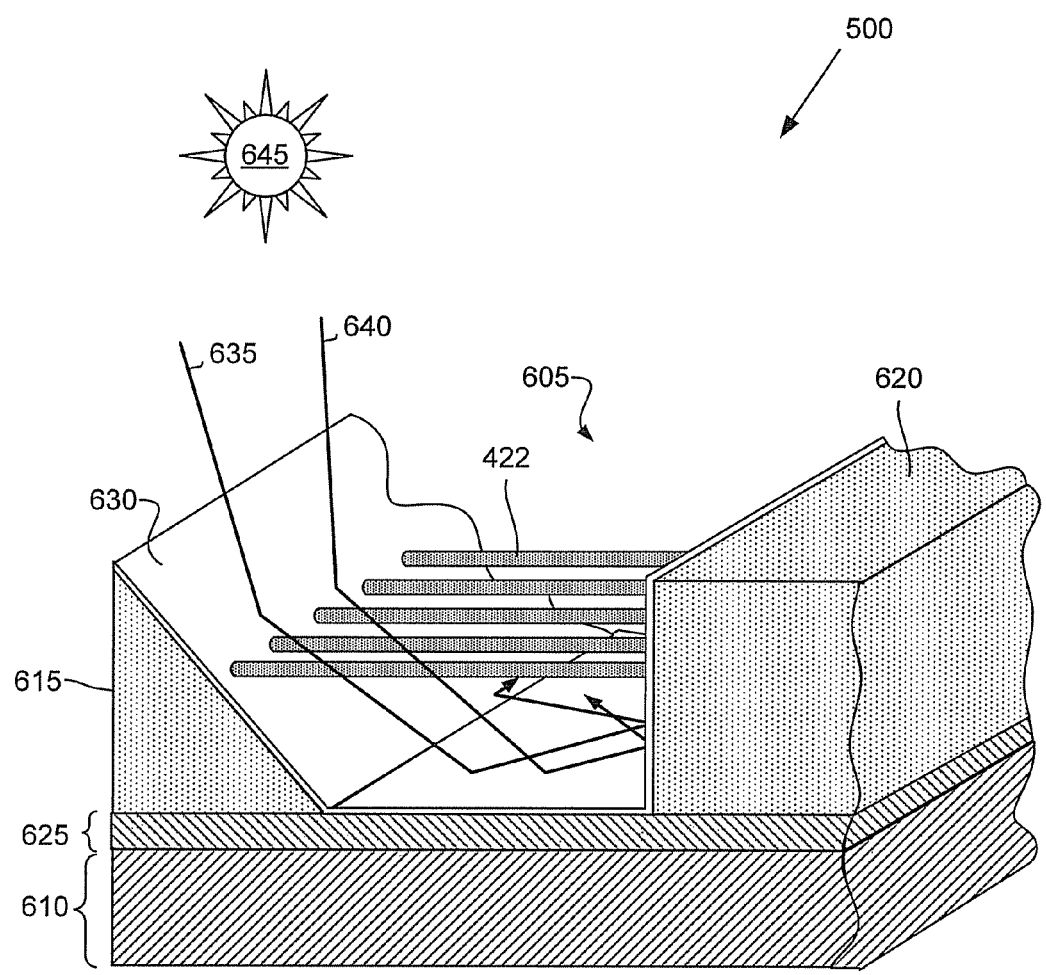
FIG. 5 is a perspective diagram of an illustrative nanowire photodetector, according to one embodiment of principles described herein.

The nanowire photodiodes can be incorporated into a number of structures which support the nanowires and direct light toward the nanowires. FIG. 5 shows on illustrative photodetector (500) which incorporates a number of photodiodes (422) within a photon trap (605). These nanowire photodiodes (422) may have a number of structures including the core/shell structure described in FIGS. 3A-3C, and FIG. 4. The photon trap (605) may include an open reflective cavity, formed on a semiconductor substrate (610). The walls (615, 620) of the photon trap (605) may be formed from doped semiconductor material and be electrically and physically coupled to the nanowires (422), which may extend horizontally from a first wall (615) to a second wall (620). One or more layers of oxide (625) may insulate the first and second walls (615, 620) from each other and from the semiconductor substrate (610).

The inner surfaces of the photon trap (605) may be coated with a reflective layer (630) such as, for example, a layer of silver and/or aluminum. The walls (615, 620) may remain electrically insulated from each other by, for example, a discontinuity in the reflective layer (630) and/or an insulating layer disposed between the electrically conductive doped portions of the walls (615, 620) and the reflective layer (630). Additionally or alternatively, the area in each of the walls (615, 620) around the immediate circumference of each side of the nanowire photodiodes (422) where the nanowire photodiodes (422) join the walls (615, 620) may be free of the reflective material of the reflective layer (630). In the present example, the inner surface of the first wall (615) of the photon trap (605) is at an angle from the semiconductor substrate (610), thereby forming a slanted mirror. Many different shapes and configurations of reflective surfaces may be used in the photon trap (605) as may best suit a particular application. The orientation of the reflective surfaces in the photon trap (605) may be configured to reduce light lost from the structure and/or concentrate received light in the vicinity of the nanowires (422). For example, exemplary paths (635, 640) of radiated light from a source (645) are shown in FIG. 5; the paths (635, 640) include multiple bounces within the photon trap (605) before the radiated light exits the photon trap (605).

Figure 6:
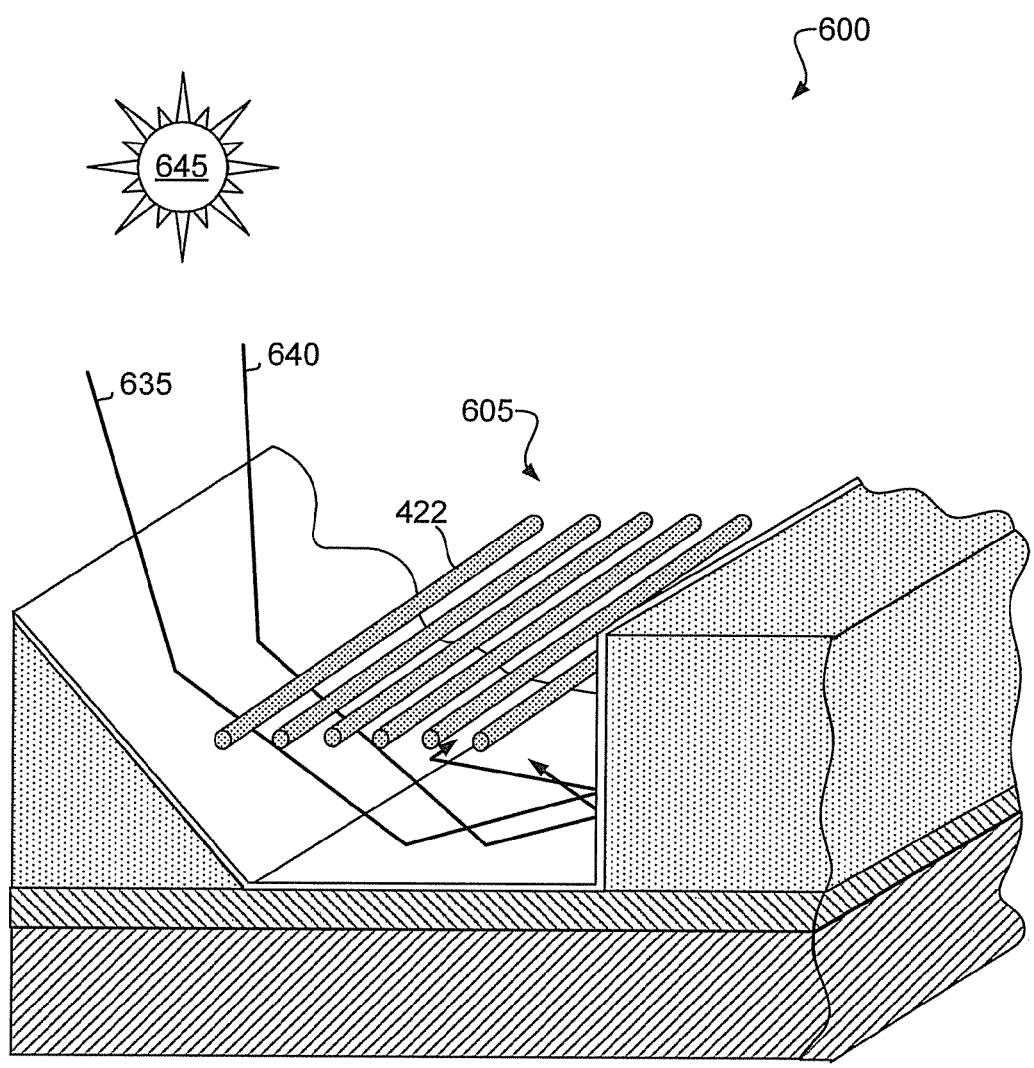
FIG. 6 is a perspective diagram of an illustrative nanowire photodetector, according to one embodiment of principles described herein.

Similarly, FIG. 6 is a photodetector (600) which includes a number of photodiodes (422). However, the photodiodes are rotated 90 degrees with respect to the photon trap (605). This or other orientations may produce higher photon trapping and absorption by the photodiodes (422). According to one illustrative embodiment, the photodiodes (422) may have blackened outer surfaces. In the specification and appended claims, the term "blackened" refers to a surface which has been specifically designed or altered to more efficiently absorb wavelengths of light within one or more wavelength ranges. For example, where the photon source (645) is the sun, the surface of the photodiodes (422) may be blackened to absorb photons (635, 640) within the solar spectrum.

Figure 7:
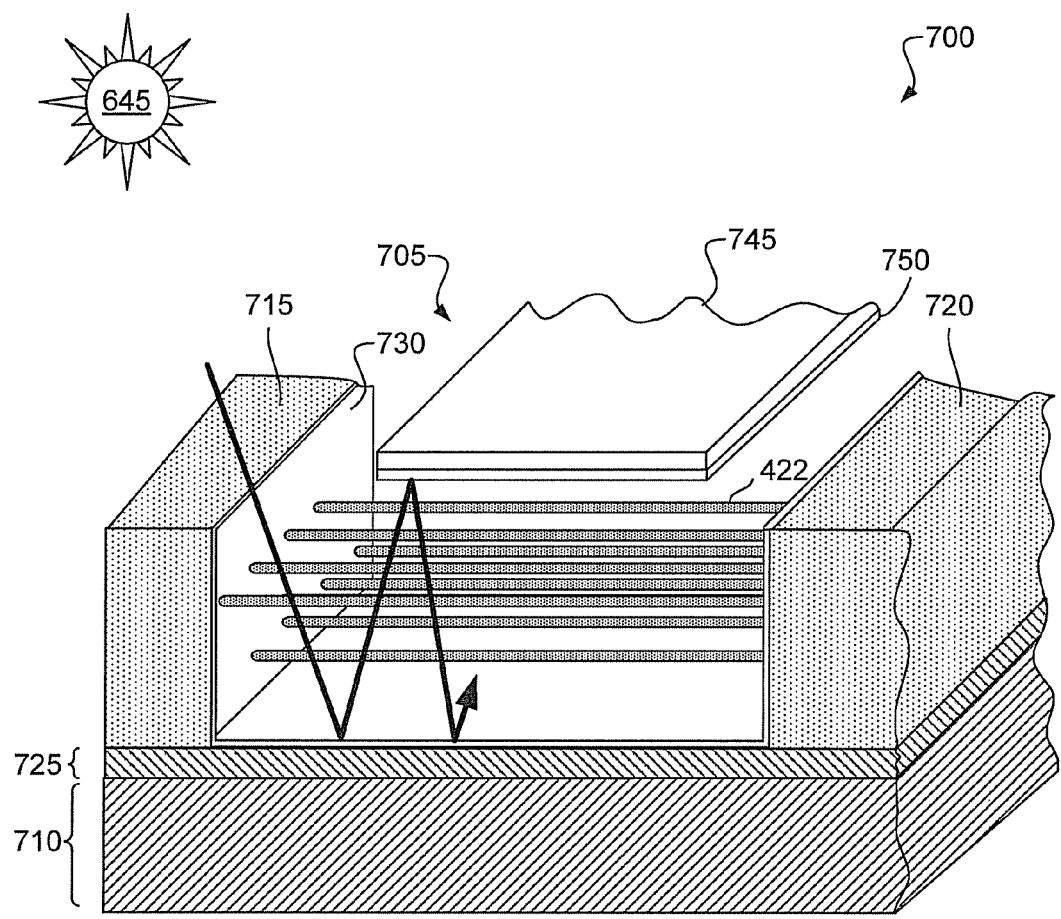
FIG. 7 is a perspective diagram of an illustrative nanowire photodetector, according to one embodiment of principles described herein.

FIG. 7 shows another illustrative photodetector (700). Like previous examples, the photodetector (700) includes a plurality of nanowire photodiodes (422) disposed within a photon trap (705) fabricated on a semiconductor substrate (710) and suspended between doped first and second walls (715, 720) of the photon trap (705). The first and second walls (715, 720) of the photon trap (705) are insulated electrically from each other and from the semiconductor substrate (710) by an oxide layer (725). A reflective layer (730) is also disposed over the inner surface of the cavity of the photon trap (705), including the bottom of the cavity and the inner surfaces of the first and second walls (715, 720). The first and second walls (715, 420) may be electrically insulated from each other by taking any of the measures described previously with respect to FIGS. 5 and 6.

The photon trap (705) of the present example includes an open reflective cavity with a top reflector (745) disposed above the cavity of the photon trap (705). At least the underside of the top reflector (745) may include a reflective layer (750) that creates a top mirror configured to reflect radiated electromagnetic energy back into the cavity of the photon trap (705), thereby increasing the number of times that the electromagnetic energy is directed into the vicinity of the nanowire photodiodes (422).

Figure 8:
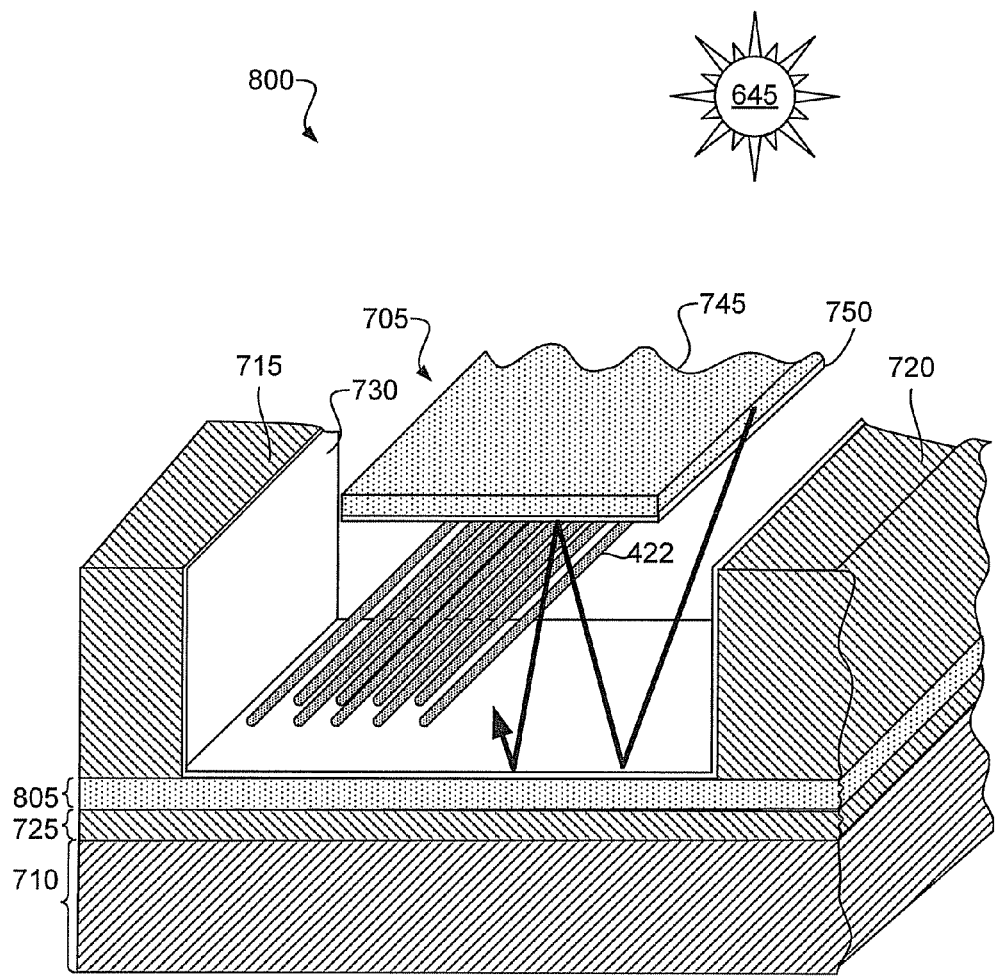
FIG. 8 is a perspective diagram of an illustrative nanowire photodetector, according to one embodiment of principles described herein.

Referring now to FIG. 8, another illustrative photodetector (800) is shown. The present photodetector (800) is similar to that of FIG. 7, with the exception that the nanowire photodiodes (422) of the present example extend up from a bottom electrode (805) to the top reflector (845), which also functions as a second electrode.

Figure 9:
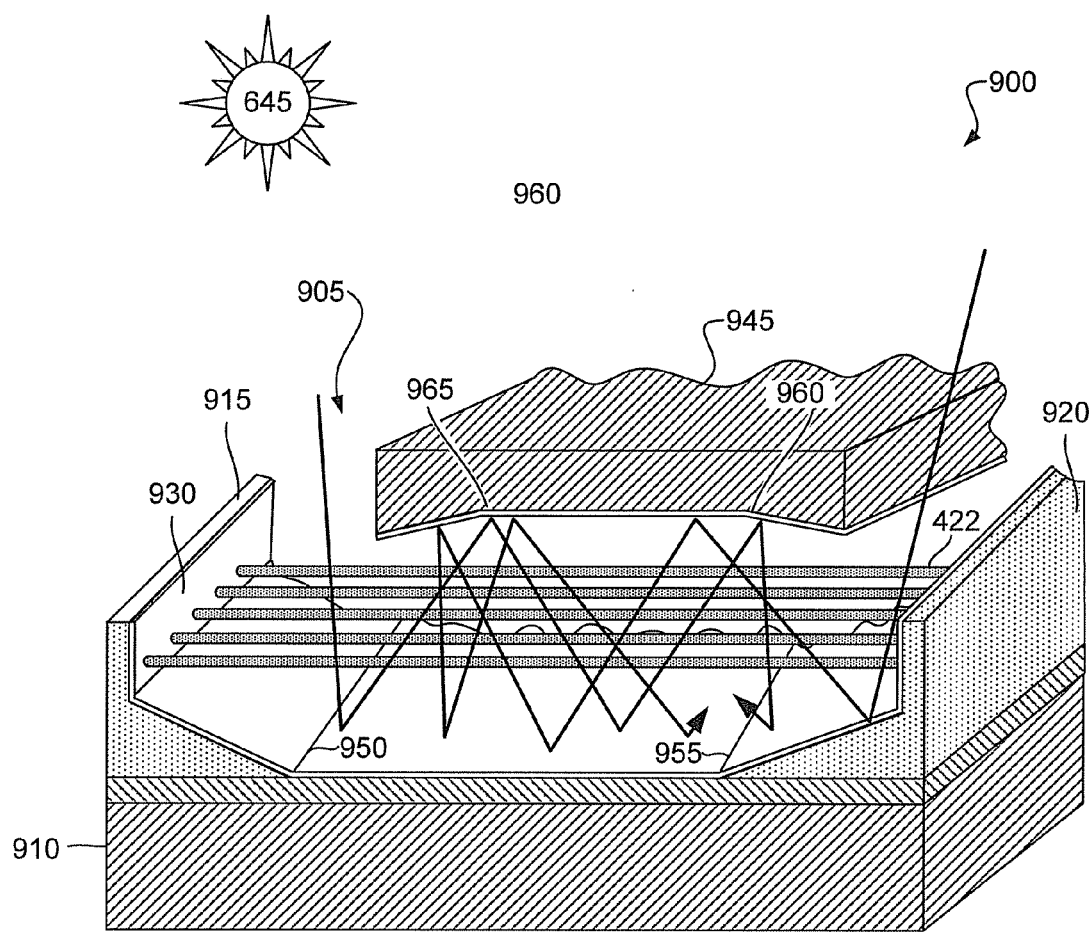
FIG. 9 is a perspective diagram of an illustrative nanowire photodetector, according to one embodiment of principles described herein.

Referring now to FIG. 9, another illustrative photodetector (900) is shown. Like previous examples, the photodetector (900) includes a plurality of nanowire photodiodes (100) disposed within a photon trap (905) fabricated on a semiconductor substrate (910) and suspended between doped first and second walls (915, 920) of the photon trap (905). A reflective layer (930) is disposed over the inner surface of the cavity of the photon trap (905), and a top reflector (945) is disposed above the cavity of the photon trap (905). The first and second walls (915, 920) may be electrically insulated from each other by taking any of the measures described previously with respect to FIG. 6.

Additionally, the reflective inner surface of the photon trap (905) cavity and the reflective surface of the top reflector (945) may include one or more V-grooves (950, 955, 960, 965). The V-grooves (950, 955, 960, 965) may aid in reflecting radiated electromagnetic energy toward the nanowire photodiodes (422).

Figure 10:
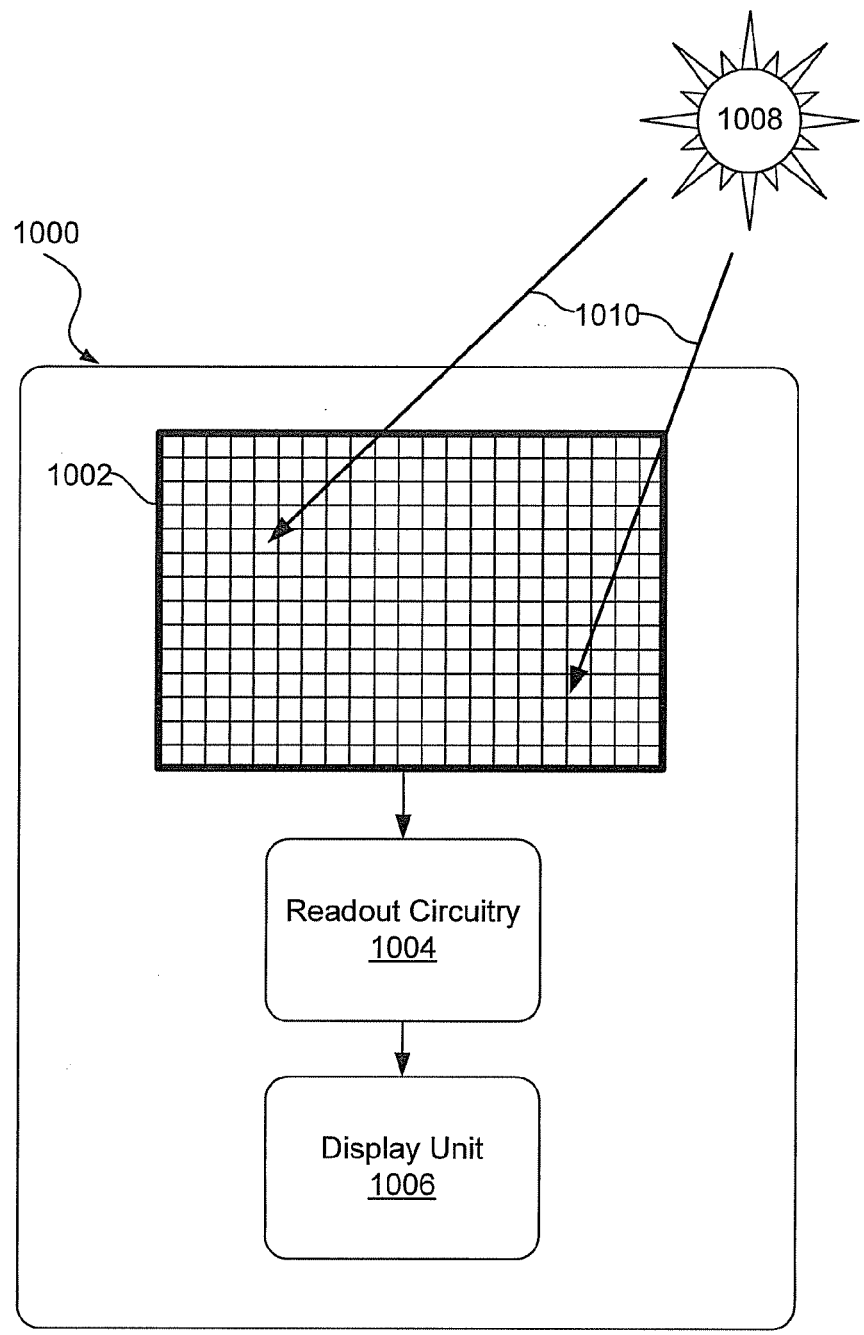
FIG. 10 is a diagram illustrating an exemplary imaging device using nanowire photodiodes, according to one embodiment of principles described herein.

FIG. 10 is a diagram illustrating an exemplary imaging device (1000) using nanowire photodiodes. According to one illustrative embodiment, a two-dimensional array (1002) of photodetectors could be used to detect electromagnetic radiation (1010) emanating from an electromagnetic radiation source (1008). The photodetectors within the array may comprise nanowires having a core/shell structure with the core having a narrow gap semiconductor material and the shell having a wide gap semiconductor material. The photodetector array (1002) could be connected to readout circuitry (1004) configured to measure the electrical current produced in each photodetector. This readout circuitry (1004) may then be configured to display the information to a display unit (1006) in a form suitable for viewing by humans.

Figure 11:
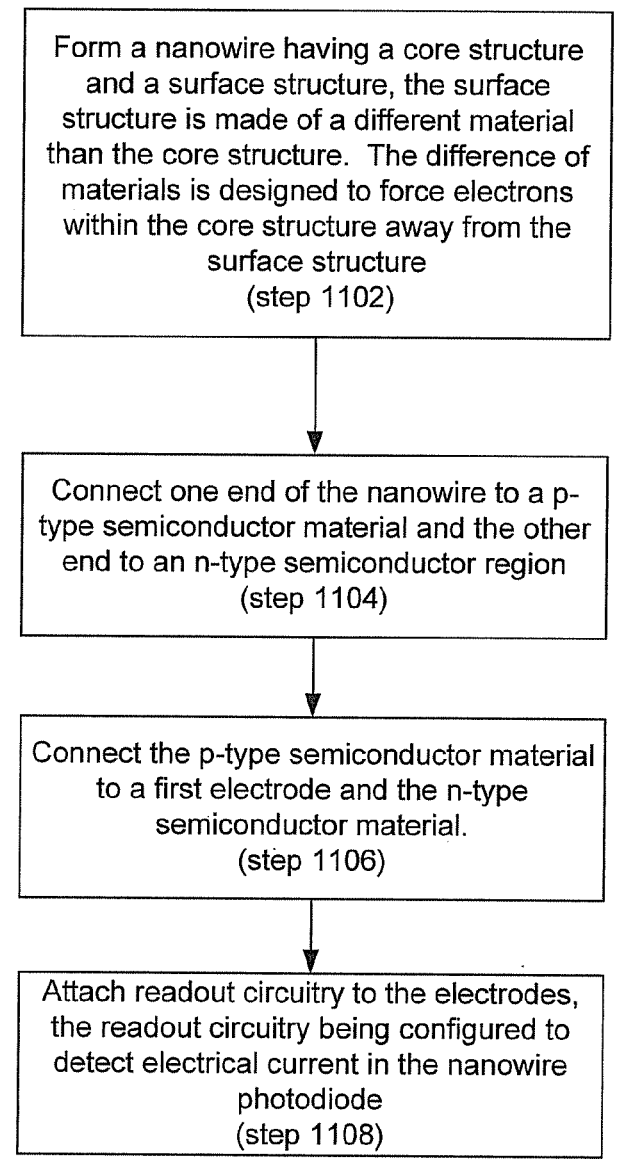
FIG. 11 is a flow chart illustrating an exemplary method for forming a nanowire photodiode, according to one embodiment of principles described herein.

FIG. 11 is a flow chart illustrating an exemplary method (1100) for making and using a nanowire photodetector. At least one nanowire photodiode is formed (step 1102) having a core structure and a surface structure. The surface structure is made of a different material than the core structure. The difference of the two materials is designed to force free electrons within the core structure away from the surface structure. In one embodiment, the core structure is formed with a narrow band gap semiconductor material and the surface structure is formed with a wide band gap semiconductor material. In one embodiment, the core structure is formed with a near intrinsic semiconductor material and the surface of the core structure is doped to form an n-type semiconductor material forming the shell structure. One end of the nanowire is connected (step 1104) to a p-type semiconductor material and the other end is connected to an n-type semiconductor material. The p-type semiconductor material is connected (step 1106) to a first electrode, and the n-type semiconductor material is connected to a second electrode. Readout circuitry which is configured to detect electrical current is attached (step 1108) to the electrodes.

In sum, the efficiency of a nanowire photodiode can be increased by creating a nanowire structure that keeps electrons in the conduction band from recombining holes at or near the surface of the nanowire. In one embodiment, this structure can be formed by creating a core/shell structure in the intrinsic region. The core will have a narrow band gap material and the shell will have a wide band gap material. In one embodiment, the surface of the intrinsic nanowire can be doped to form the wide band gap material. One or more of the nanowires may be disposed within a photon trap to increase the efficiency of the photodiode in absorbing incident photons.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A photodiode comprising:
   a first electrode;
   a second electrode;
   a nanowire comprising a semiconductor core, a semiconductor shell, a first heavily doped end section, and a second heavily doped end section, in which the first heavily doped end section is in direct electrical contact with the first electrode, the semiconductor core, and the semiconductor shell; and the second heavily doped end section is in direct electrical contact with the second electrode, the semiconductor core, and the semiconductor shell, in which the semiconducting shell comprises a material with a wider energy band gap than the semiconductor core.

2. The photodiode according to claim 1, in which the first heavily doped end section comprises a same dopant as the second heavily doped end section.

3. The photodiode according to claim 2, in which the first heavily doped end section comprises a same dopant as the semiconductor core.

4. The photodiode according to claim 1, which the first heavily doped end section has a dopant with a charge which is opposite the dopant in the second heavily doped end section.

5. The photodiode according to claim 1, in which the semiconductor shell comprises an n-type semiconductor material and the semiconductor core comprises a charge depleted semiconductor material.

6. The photodiode according to claim 1, in which the semiconductor shell comprises an n-type semiconductor material and the semiconductor core comprises a semiconductor material which is lightly doped with an acceptor material.

7. The photodiode according to claim 1, in which the semiconductor core comprises a narrower energy band gap semiconductor material than the shell semiconductor material.

8. The photodiode according to claim 7, in which the narrow energy band gap semiconductor material is a binary III-V semiconductor.

9. The photodiode according to claim 1, in which the semiconductor comprises a ternary III-V semiconductor.

10. The photodiode according to claim 1, further comprising a plurality of nanowires disposed in a photon trap.

11. The photodiode according to claim 10, in which the photon trap comprises at least one of: a side reflector slanted with respect to the plurality of nanowires, a conical reflector, and a reflector having at least one V-groove.

12. The photodiode according to claim 10, in which the photon trap comprises a reflector disposed above the plurality of nanowire photodiodes and configured to reflect light back into the photon trap.

13. The photodiode of claim 1, in which the first heavily doped end section of the nanowire is in electrical contact with a cross-sectional area of both the semiconductor core and semiconductor shell and the second heavily doped end section of the nanowire is in electrical contact with the cross-sectional area of both the semiconductor core and semiconductor shell.

14. A method comprising:
   forming a nanowire photodiode comprising a core structure and a surface structure, the surface structure comprising a material having a different energy band gap than the core structure; in which the different energy band gap is configured to force electrons within the core structure away from the surface structure;
   connecting one end of the nanowire photodiode to a p-type semiconductor material and the other end of the nanowire photodiode to an n-type semiconductor material;
   connecting the p-type semiconductor material to a first electrode and the n-type semiconductor material to a second electrode; and
   attaching read out circuitry to the electrodes, the circuitry configured to detect electrical current in the nanowire photodiode.

15. The method of claim 14, in which the method of forming the nanowire photodiode comprises:

forming the core structure with a narrow band gap semiconductor material; and forming the surface structure around the core structure, the surface structure comprising a wide band gap semiconductor material.

16. The method of claim 15, in which the narrow band gap semiconductor material is a III-V semiconductor material.

17. The method of claim 14, in which the method of forming the nanowire photodiode comprises:

forming the core structure with a near intrinsic semiconductor material; and doping the surface of the core structure to create a surface structure comprising an n-type semiconductor material.

18. An imaging apparatus comprising:

a display unit;

readout circuitry; and a two-dimensional array of nanowire photodetectors, each nanowire photodetector comprising;

at least one photodiode comprising at least one nanowire associated with a photon trap, the at least one nanowire comprising a core structure comprising a narrow gap semiconductor material and a shell structure comprising a wide gap semiconductor material;

in which the at least one nanowire is connected to an electrode on each end, the electrodes being connected to readout circuitry configured to measure the current produced by each the photodiode; and measurements obtained by the readout circuitry, the measurements being configured to create and display an image on the display unit.

19. A photodiode comprising:

a first electrode;

a second electrode;

a nanowire comprising a first end and a second end, the first end being in electrical contact with the first electrode and the second end being in contact with the second electrode; the nanowire further comprising one of:

an n-type semiconductor shell and a charge depleted semiconductor core; or an n-type semiconductor shell and a semiconductor core comprising a lightly doped acceptor material;

in which the semiconducting shell comprises a material with a wider energy band gap than the semiconductor core.

20. The photodiode according to claim 19, in which the semiconductor core comprises a narrower energy band gap semiconductor material than the shell semiconductor material, in which the narrow energy band gap semiconductor material is one of: a binary III-V semiconductor or a ternary III-V semiconductor.

21. The photodiode according to claim 19, further comprising a plurality of nanowires disposed in a photon trap, in which the photon trap comprises at least one of: a side reflector slanted with respect to the plurality of nanowires, a conical reflector, and a reflector having at least one V-groove.

22. The photodiode according to claim 21, in which the photon trap comprises a reflector disposed above the plurality of nanowire photodiodes and configured to reflect light back into the photon trap.

* * * * *

UNITED STATES PATENT AND TRADEMARK OFFICE
CERTIFICATE OF CORRECTION

PATENT NO. : 8,390,705 B2
APPLICATION NO. : 12/606947
DATED : March 5, 2013
INVENTOR(S) : Alexandre M. Bratkovski et al.

Page 1 of 1

It is certified that error appears in the above-identified patent and that said Letters Patent is hereby corrected as shown below:

On the Title page, in item (75), Inventors, in column 1, line 2, delete "Vilatcheslav" and insert -- Viatcheslav --, therefor.

On the Title page, in item (73), Assignee, in column 1, line 1, delete "Develoment" and insert -- Development --, therefor.

In the Claims:

In column 10, line 14, in Claim 4, delete "which" and insert -- in which --, therefor.

In column 11, line 18, in Claim 18, delete "comprising;" and insert -- comprising: --, therefor.

Signed and Sealed this
First Day of October, 2013

Teresa Stanek Rea
*Deputy Director of the United States Patent and Trademark Office*